United States Patent
Jeong

(10) Patent No.: US 11,688,839 B2
(45) Date of Patent: Jun. 27, 2023

(54) LED MODULE AND VEHICLE INCLUDING THE SAME

(71) Applicant: HYUNDAI MOBIS CO., LTD., Seoul (KR)

(72) Inventor: Seok Ho Jeong, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/567,541

(22) Filed: Jan. 3, 2022

(65) Prior Publication Data

US 2023/0092051 A1 Mar. 23, 2023

(30) Foreign Application Priority Data

Sep. 17, 2021 (KR) .................. 10-2021-0125274

(51) Int. Cl.
*H01L 33/58* (2010.01)
*H01L 33/48* (2010.01)

(52) U.S. Cl.
CPC ............ *H01L 33/58* (2013.01); *H01L 33/483* (2013.01)

(58) Field of Classification Search
None
See application file for complete search history.

(56) References Cited

U.S. PATENT DOCUMENTS

| | | | |
|---|---|---|---|
| 2008/0048200 A1* | 2/2008 | Mueller | H01L 33/505 257/E21.353 |
| 2015/0331169 A1* | 11/2015 | Jang | F21S 43/249 362/607 |
| 2018/0226384 A1* | 8/2018 | Park | H01L 33/58 |
| 2018/0248089 A1* | 8/2018 | Zhou | H01L 33/60 |

FOREIGN PATENT DOCUMENTS

| | | | | |
|---|---|---|---|---|
| CN | 107490815 B | * | 3/2020 | ......... B29C 33/0022 |
| JP | 2008077104 A | * | 4/2008 | |
| KR | 20150108212 A | * | 9/2015 | |

* cited by examiner

*Primary Examiner* — Fatima N Farokhrooz
(74) *Attorney, Agent, or Firm* — NovoTechIP International PLLC

(57) ABSTRACT

Disclosed is an LED module including a cover part, a board part connected to a front portion of the cover part, a light emitting part electrically connected to the board part, positioned on a front portion of the board part, and that emits light through a side surface thereof, a lens part surrounding the side surface of the light emitting part and positioned on the front portion of the board part, and a panel part, into which the lens part is inserted, having an optic part having a fine boss shape on an outer surface thereof, and positioned on the front portion of the board part.

18 Claims, 24 Drawing Sheets

LED MODULE AND VEHICLE INCLUDING THE SAME

CROSS-REFERENCE TO RELATED APPLICATION

This application claims the benefit of priority to Korean Patent Application No. 10-2021-0125274, filed in the Korean Intellectual Property Office on Sep. 17, 2021, the entire contents of which are incorporated herein by reference.

TECHNICAL FIELD

The present disclosure relates to an LED module and a vehicle including the same.

BACKGROUND

LED modules are used in various fields, such as lamps for a vehicle. FIG. 1 is a conceptual view illustrating a conventional LED module 1. As illustrated in FIG. 1, a conventional LED module 1 has a problem, most of light emitted from an LED 2 travels only to a front side, and thus a structure, such as a reflection plate 3, is necessary to direct the light to a lateral side. Accordingly, a space of 20 mm or more has to be secured, and thus, an entire weight of an LED module may increase. Further, due to the structures, there is a restriction in disposition of the LED module, and it is difficult to implement a free design.

Furthermore, because the conventional LED module directs most or the light only to the front side, a brightness of a portion, at which the light mainly gathers, becomes higher than that of a surrounding portion. FIG. 2 is a conceptual view illustrating a lamp for a vehicle, to which a conventional LED module is applied. As illustrated in FIG. 2, it is difficult to secure a uniformity of a brightness of a lamp L for a vehicle, to which the conventional LED module is applied.

SUMMARY

The present disclosure has been made to solve the above-mentioned problems occurring in the prior art while advantages achieved by the prior art are maintained intact.

An aspect of the present disclosure provides an LED module that has a reduced volume and a reduced weight.

Another aspect of the present disclosure provides an LED module that may secure a uniformity of brightness.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an LED module includes a cover part, a board part connected to a front side of the cover part, a light emitting part electrically connected to the board part, disposed on a front side of the board part, and that emits light through a side surface thereof, a lens part surrounding the side surface of the light emitting part and disposed on the front side of the board part, and a panel part, into which the lens part is inserted, having an optic part having a fine boss shape on an outer surface thereof, and disposed on the front side of the board part.

In another example, the optic part may include a first optic part formed on a rear surface of the panel part to be recessed to a front side, and that reflects the light emitted from the side surface of the light emitting part and guides the reflected light toward the front side.

In another example, the optic part may further include a second optic part formed on a front surface of the panel part to be protruded toward the front side, and that guides the light emitted from the side surface of the light emitting part toward the front side.

In another example, the first optic part and the second optic part may have corresponding shapes.

In another example, the first optic part may have a shape, of which an upward/downward length decreases as it goes to the front side.

In another example, an upward/downward length of the board part may correspond to an upward/downward length of the cover part.

In another example, an upward/downward length of the panel part may correspond to an upward/downward length of the board part.

In another example, the board part may have a white color.

In another example, the LED module may further include an outer lens disposed to be spaced apart from the panel part to a front side.

In another example, an upward/downward length of the outer lens may correspond to an upward/downward length of the panel part.

In another example, the LED module may further include an inner lens disposed between the outer lens and the panel part.

In another example, the panel part may include a first recess formed on a rear surface thereof to be recessed in correspondence to a shape of the lens part, and the lens part may be inserted into the first recess.

In another example, an upward/downward length of the board part may be smaller than an upward/downward length of the cover part, the panel part may cover a side surface of the board part, and the optic part may include a first area formed on the side surface of the board part, and a second area formed on a front surface of the board part and stepped from the first area.

In another example, the panel part may further include a second recess famed on a rear surface thereof to be recessed in correspondence to a size of the board part, and the board part may be inserted into the second recess.

In another example, the lens part may have a shape obtained by cutting an ellipse into a half along a central axis thereof, when viewed from the side surface thereof.

In another example, the lens part may have a shape, in which a front end of a shape obtained by cutting an ellipse into a half along a central axis thereof is recessed to a rear side, when viewed from the side surface thereof.

In another example, the lens part may have a shape, in which a front end of a shape obtained by cutting an ellipse into a half along a central axis thereof is concave to a rear side, when viewed from the side surface thereof.

According to another aspect of the present disclosure, a vehicle includes a vehicle body, and an LED module inserted into the vehicle body, and the LED module may include a light emitting part that emits light through a side surface thereof, a lens part surrounding a side surface of the light emitting part, and an optic part, into which the lens part is inserted, and having a fine boss shape on an outer surface thereof.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
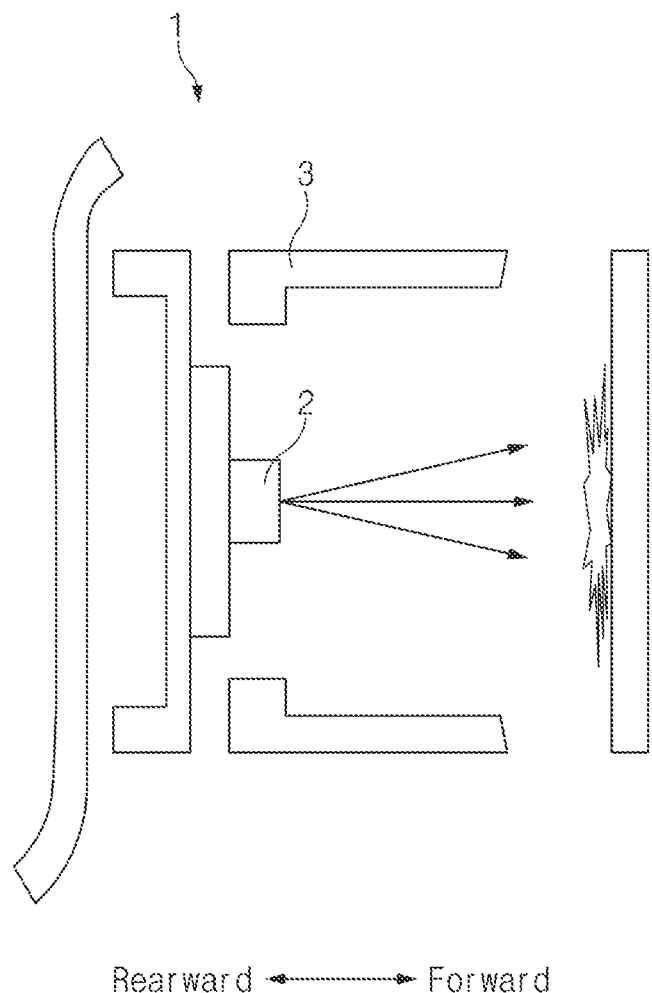
FIG. 1 is a conceptual view illustrating a conventional LED module.

Hereinafter, some embodiments of the present disclosure will be described in detail with reference to the exemplary drawings. In providing reference numerals to the constituent elements of the drawings, the same elements may have the same reference numerals even if they are displayed on different drawings. Further, in the following description of the present disclosure, a detailed description of known functions and configurations incorporated herein will be omitted when it may make the subject matter of the present disclosure rather unclear.

LED Module According to First Embodiment

Figure 3:
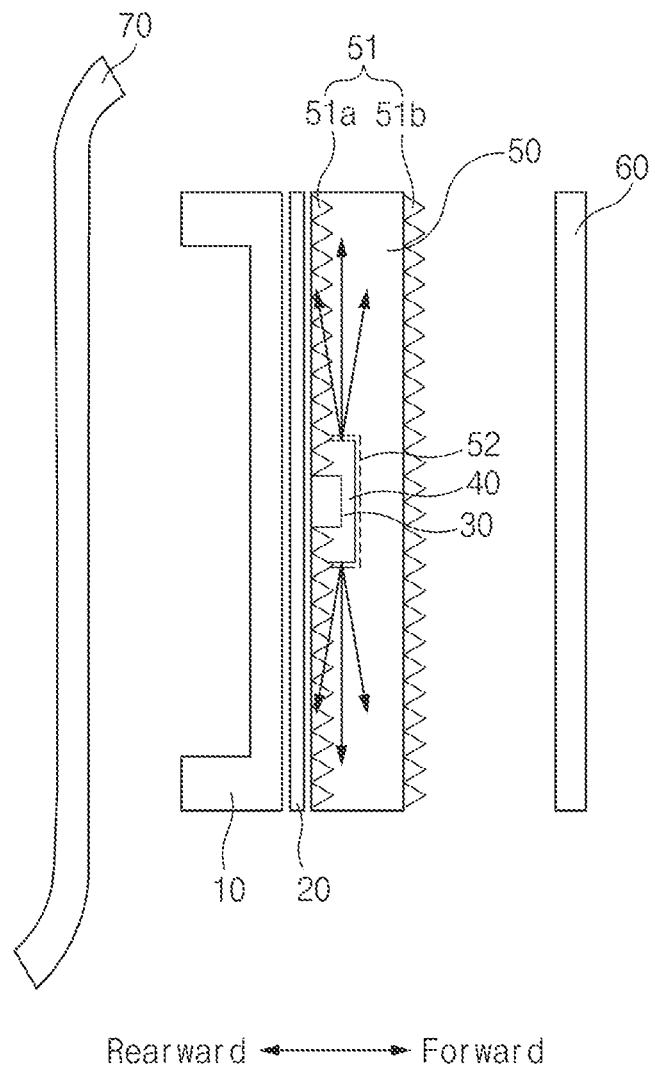
FIG. 3 is a conceptual view illustrating an LED module according to a first embodiment of the present disclosure.

An LED module according to a first embodiment of the present disclosure relates to an LED module that may be applied to a lamp for a vehicle or the like. FIG. 3 is a perspective view illustrating an LED module according to a first embodiment of the present disclosure. Arrows of FIG. 3 may mean paths of light emitted from the light emitting part.

Basic Elements of LED Module According to First Embodiment

As illustrated in FIG. 3, an LED module according to an embodiment of the present disclosure may include a cover part 10, a board part 20, a light emitting part 30, a lens part 40, and a panel part 50. The board part 20 may be connected to a front portion, for example, a front side of the cover part 10. The board part 20 may be a general printed circuit board (PCB). The board part 20 may have a white color. Then, when the light emitting part 30, which will be described below, is a white colored LED, a high reflectivity of the board part 20 may be secured, and visibility may become excellent. However, the color of the board part 20 is not limited thereto, and may have various examples according to the color of the light emitting part 30. As an example, when the light emitting part 30 is a red-colored LED, the board part 20 also may be red-colored.

The light emitting part 30 may be electrically connected to the board part 20, and may be positioned at a front portion, for example, on a front side, of the board part 20. The light emitting part 30 may be configured to emit light through a side surface thereof. More preferably, the light emitting part 30 may four side surfaces, and the light emitting part 30 may emit light through the above-described four surfaces.

The lens part 40 may surround the side surfaces of the light emitting part 30, and may be positioned on the front side of the board part 20. Although FIG. 3 illustrates that the lens part 40 has a rectangular cross-section, this is a simple example, and the lens part 40 may have various shapes for forming a uniform light distributing pattern. This will be described in detail later. The lens part 40 may refract the light emitted from the light emitting part 30.

The panel part 50 may have an optic part 51 having a fine boss shape on an outer surface thereof. The optic part 51 may reflect the light emitted from the light emitting part 30 at various angles. A plurality of optic parts 51 may be provided. Although FIG. 3 illustrates that a size of the optic part 51 is illustrated rather largely, this is for expression, and actually, the optic part 51 may have a fine size as compared with the other elements.

The LED module according to the first embodiment of the present disclosure may further include an outer lens 60. The outer lens 60 may be positioned to be spaced apart from the panel part 50 to a front side. The outer lens 60 may function as a cover for protecting internal configurations of the LED module according to the present disclosure from an outside.

Furthermore, the LED module according to the first embodiment of the present disclosure may further include a housing 70. The housing 70 may be positioned on a rear side of the cover part 10. The housing 70 may function to protect the LED module by surrounding the LED module on a rear side thereof.

That is, when the elements are listed in a sequence from the rear side to the front side, the sequence may be the housing 70, the cover part 10, the board part 20, the light emitting part 30, the lens part 40, and the panel part 50, and the outer lens 60.

According to the present disclosure, because a uniform turning-on image may be implemented while an additional space is not secured in an entire area of the light emitting part 30 to diffuse light because the light is emitted through the side surfaces of the light emitting part 30, a volume occupied by the LED module may be significantly reduced.

Furthermore, according to the present disclosure, because the light may be emitted from the side surfaces of the light emitting part 30 and the plurality of fine optic parts 51 reflect the light at various angles at different locations, a uniformity of brightness may be secured.

Figure 4:
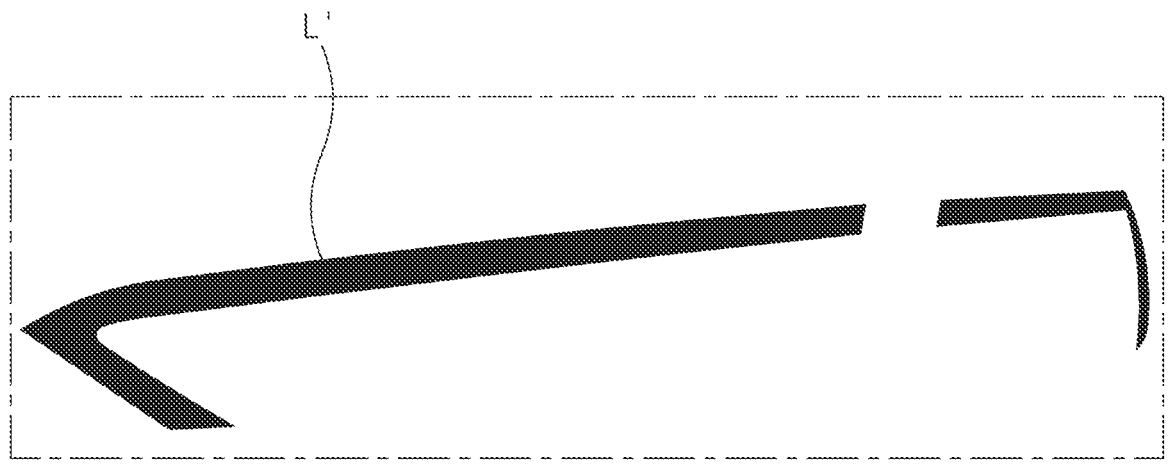
FIG. 4 is a conceptual view illustrating a lamp for a vehicle, to which an LED module according to a first embodiment of the present disclosure is applied.

FIG. 4 is a conceptual view illustrating a lamp for a vehicle, to which an LED module according to a first embodiment of the present disclosure is applied. Because the LED module according to the first embodiment of the present disclosure may reflect light at various angles, a uniformity of the brightness of the lamp L' may be secured as in FIG. 4 when a lamp is applied to the LED module according to the first embodiment of the present disclosure.

Furthermore, because the LED module according to the first embodiment of the present disclosure may secure a uniformity of brightness, the number of light sources needed in the lamp for a vehicle may be reduced.

First Optic Part 51a and Second Optic Part 51b

The optic part 51 may include a first optic part 51a. The first optic part 51a may be provided on a rear surface of the panel part 50 and may be recessed toward the front side. The first optic part 51a may be configured to reflect the light emitted from the side surface of the light emitting part 30 such that the light is guided toward the front side. The first optic part 51a may mean not only one fine boss shape but also several sets.

As an example, the first optic part 51a may have a shape, of which an upward/downward length decreases as it goes to the front side. For example, the first optic part 51a may have a semielliptical shape, which is obtained by cutting an ellipse along the y axis. Alternatively, the first optic part 51a may have a triangular shape, in which a line that is parallel to the y axis is one edge. However, the present disclosure is not limited thereto, and the shape of the first optic part 51a may have various examples.

Furthermore, the optic part 51 may include a second optic part 51b. The second optic part 51a may be provided on a front surface of the panel part 50 and may protrude toward the front side. The second optic part 51b may be configured to diffuse the light emitted from the side surface of the light emitting part 30 such that the light is guided toward the front side. The second optic part 51b also may mean not only one fine boss shape but also several sets. Furthermore, of course, the second optical part 51b also may have various shapes of the above-described first optic part 51a.

The second optic part 51b may have a shape corresponding to that of the first optic part 51a. However, here, the corresponding shapes do not necessarily mean shape the same shape, but may mean that similar arrangements under a specific rule.

For example, when a triangular shape and a ladder shape of the first optic part 51a are alternately arranged, a ladder shape and a triangular shape of the second optic part 51b may be alternately arranged.

Figure 5:
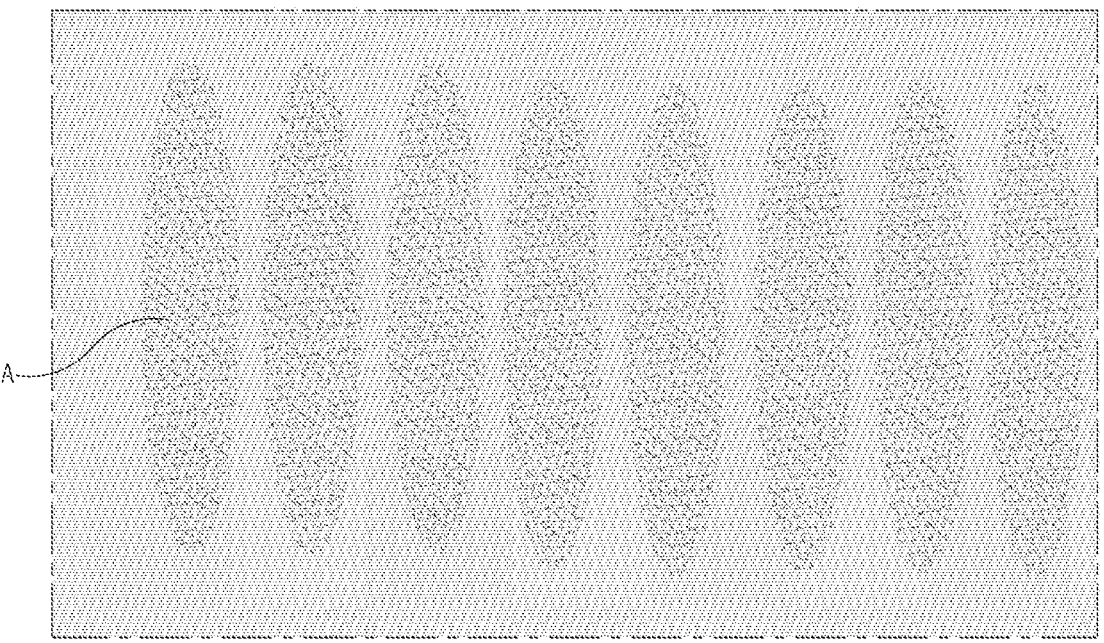
FIG. 5 is a conceptual view illustrating a light emitting pattern when shapes of a first optic part and a second optic part are triangular.
Figure 6:
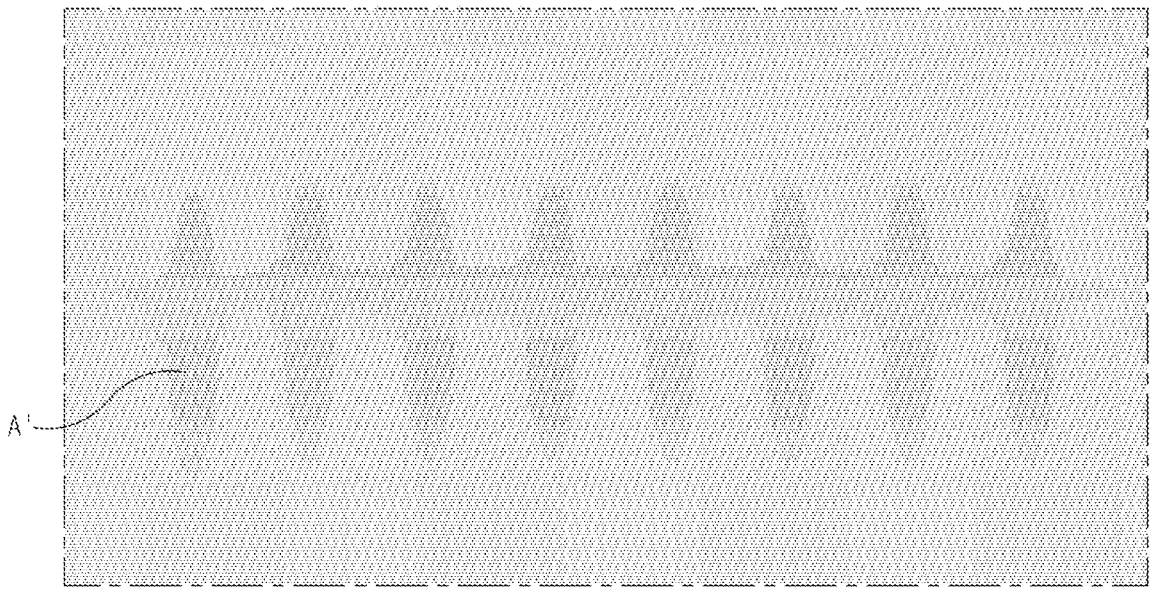
FIG. 6 is a conceptual view illustrating a light emitting pattern when shapes of a first optic part and a second optic part are elliptical.

FIG. 5 is a conceptual view illustrating a light emitting pattern when shapes of the first optic part 51a and the second optic part 51b are triangular. FIG. 6 is a conceptual view illustrating a light emitting pattern when shapes of the first optic part 51a and the second optic part 51b are elliptical. As illustrated in FIGS. 5 and 6, shapes of light emitting areas A and A' may be different according to the shape of the optic part 51. Accordingly, an operator may form the shapes of the first optic part 51a and the second optic part 51b differently according to a light emitting pattern that is to be famed.

Relationship of Sizes of Elements

Meanwhile, an upward/downward length of the board part 20 may correspond to an upward/downward length of the cover part 10. Furthermore, an upward/downward length of the panel part 50 may correspond to an upward/downward length of the board part 20. Therefore, the upward/downward length of the panel part 50 may correspond to an upward/downward length of the cover part 10.

Furthermore, an upward/downward length of the outer lens 60 may correspond to the upward/downward length of the panel part 50. Accordingly, an upward/downward length of the outer lens 60 may correspond to the upward/downward lengths of the board part 20 and the cover part 10.

Detailed Shape of Panel Part 50

The panel part 50 may include a first recess 52. The first recess 52 may be positioned on a rear surface of the panel part 50 to be recessed in correspondence to a size of the lens part 40. Here the correspondence does not necessarily mean coincidence, but may include a meaning of a space, into which the lens part 40 may be inserted, or more. For example, the first recess 52 may be formed such that a portion that protrudes from the panel part 50 is not present when the lens part 40 is inserted into and positioned in the first recess 52.

Figure 2:
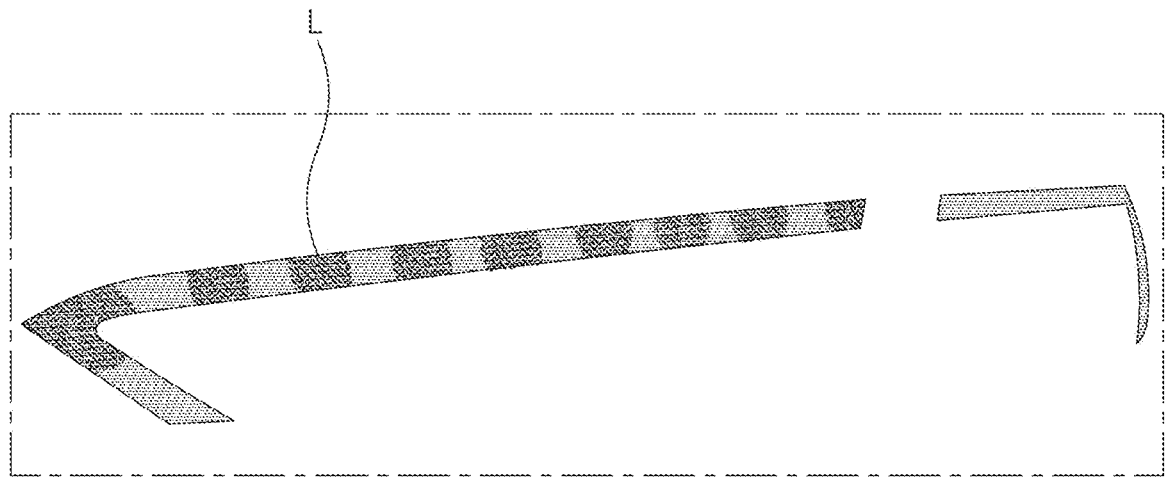
FIG. 2 is a conceptual view illustrating a lamp for a vehicle, to which a conventional LED module is applied.

As an example, as illustrated in FIG. 2, a shape of the lens part 40 including the first recess 52 may be a shape obtained by rotating a U shape by 90 degrees.

The lens part 40 may be inserted into and positioned in the first recess 52. Because the first recess 52 is formed to corresponding to the size of the lens part 40, a portion that protrudes from the panel part 50 is not present when the lens part 40 is inserted into and positioned in the first recess 52.

Figure 7:
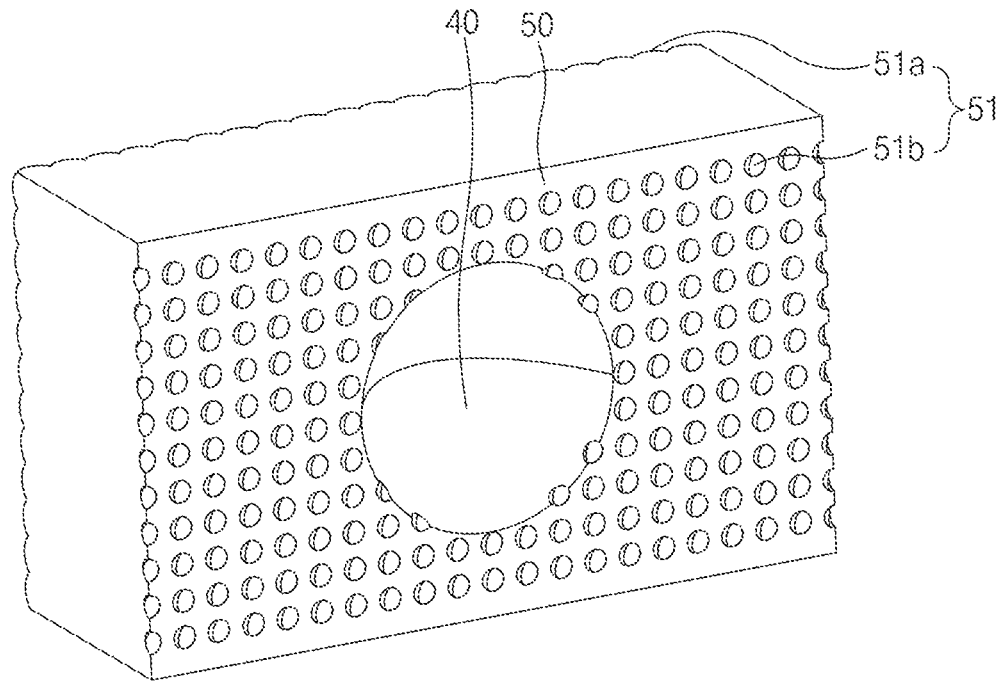
FIG. 7 is a view illustrating an example of a shape of a lens part.
Figure 8:
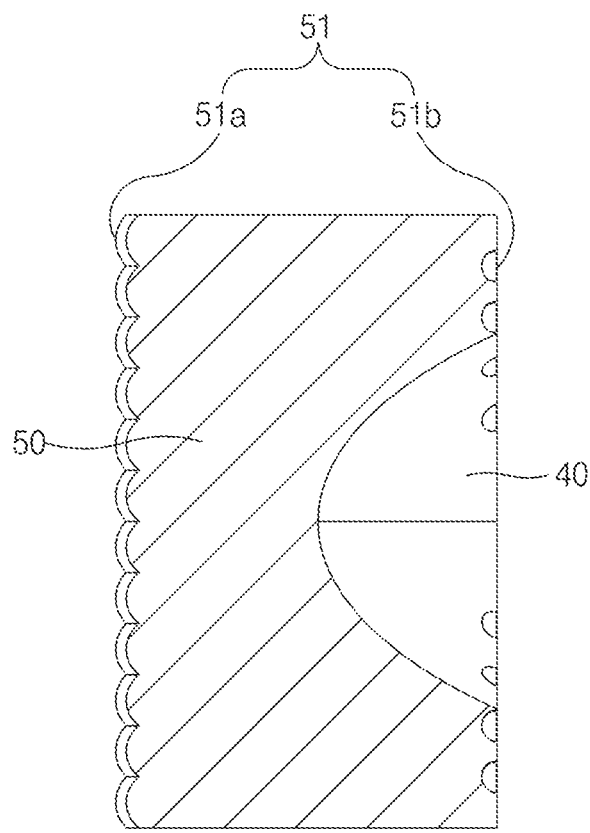
FIG. 8 is a cross-sectional view of FIG. 7.
Figure 9:
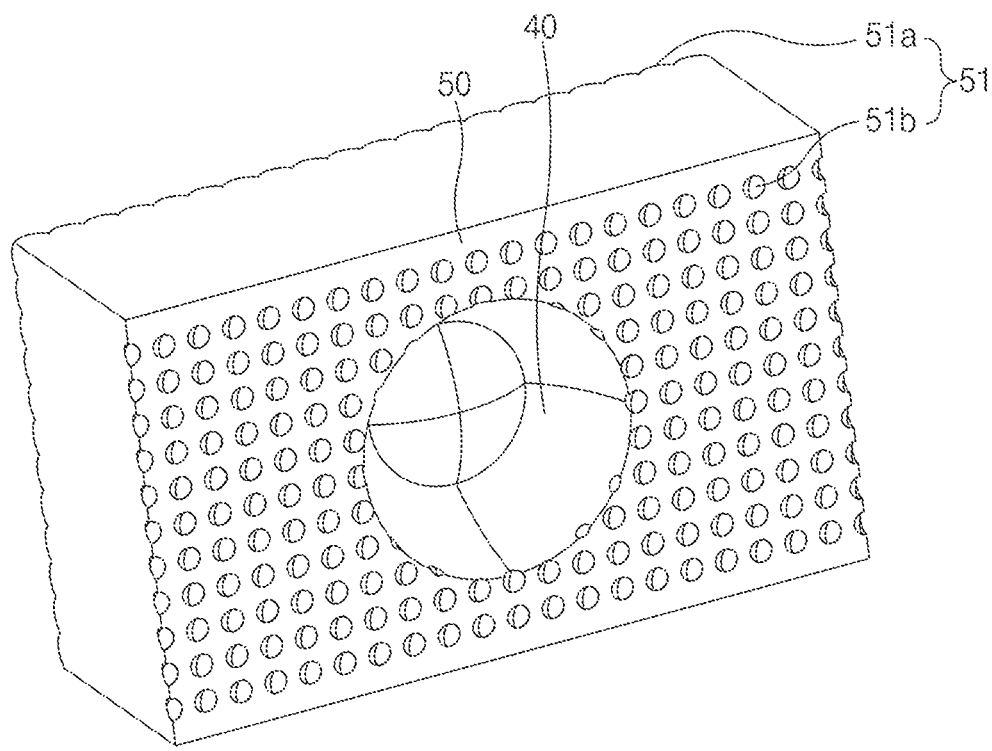
FIG. 9 is a view illustrating another example of a shape of a lens part.
Figure 10:
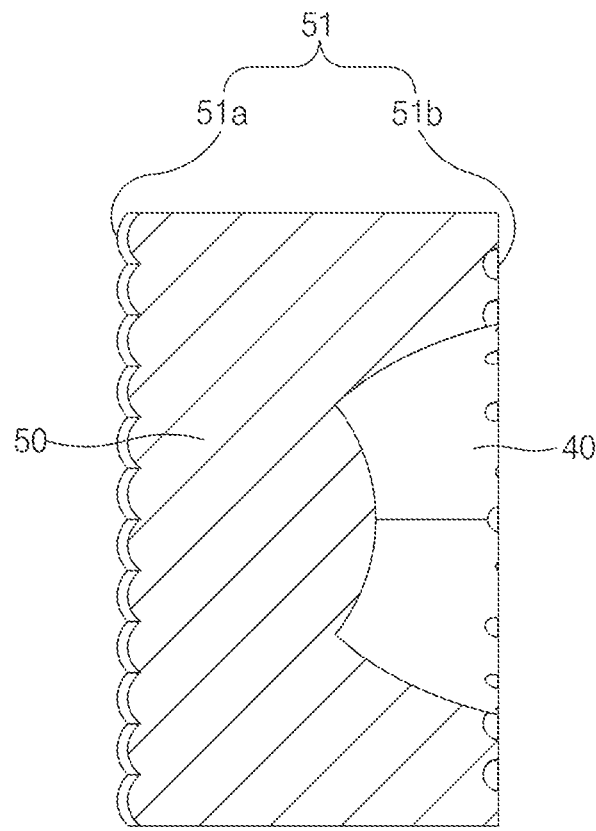
FIG. 10 is a cross-sectional view of FIG. 8.
Figure 11:
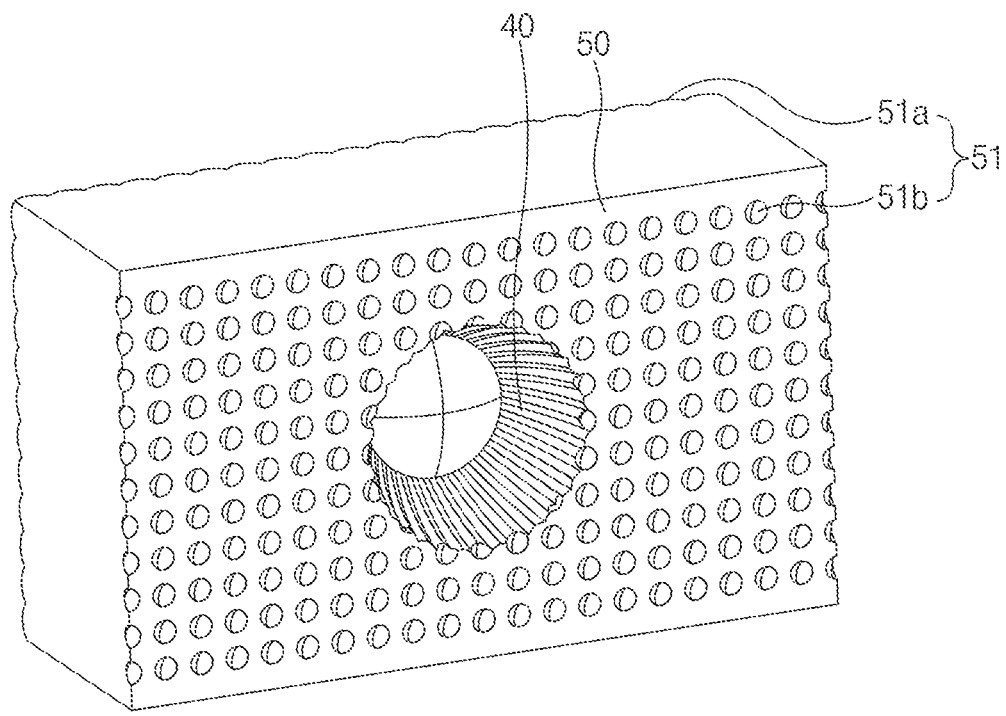
FIGS. 11, 13, 15, 17, 19, and 21 are views illustrating other examples of a lens shape of a lens part.
Figure 12:
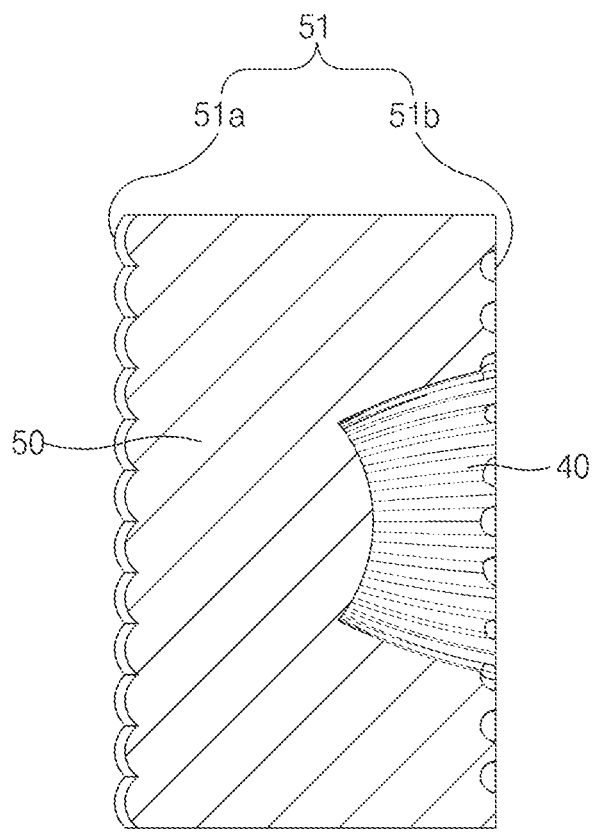
FIGS. 12, 14, 16, 18, 20, and 22 are cross-sectional views of FIGS. 11, 13, 15, 17, 19, and 21.
Figure 13:
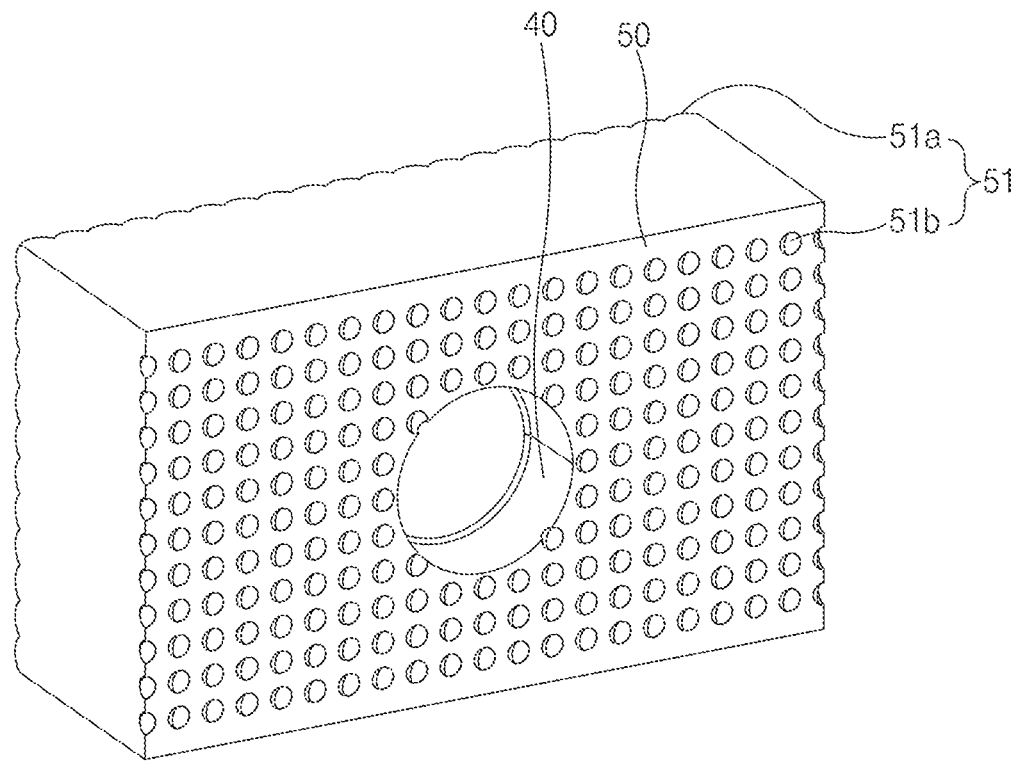
Figure 14:
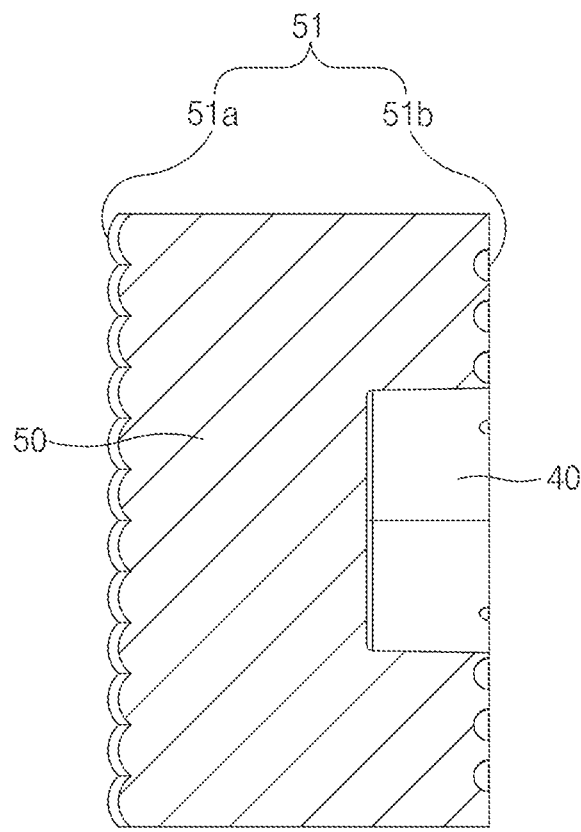
Figure 15:
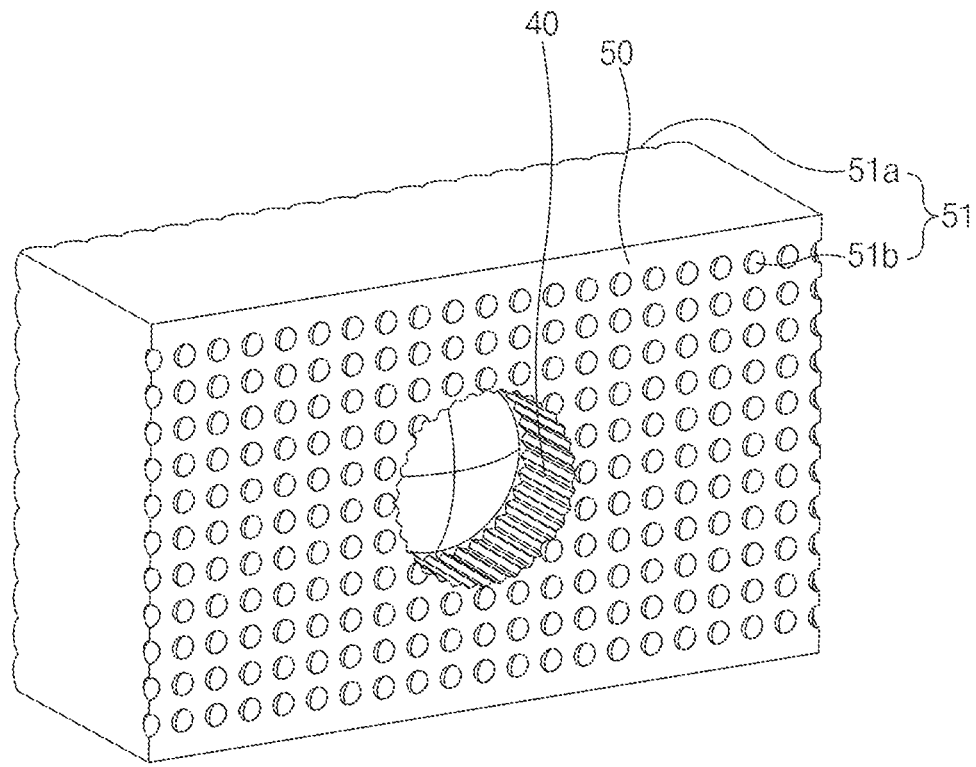
Figure 16:
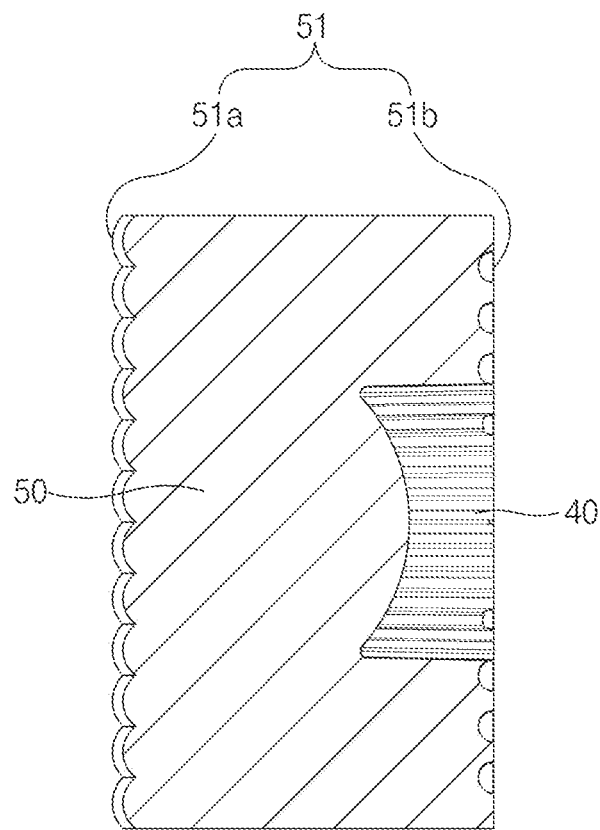
Figure 17:
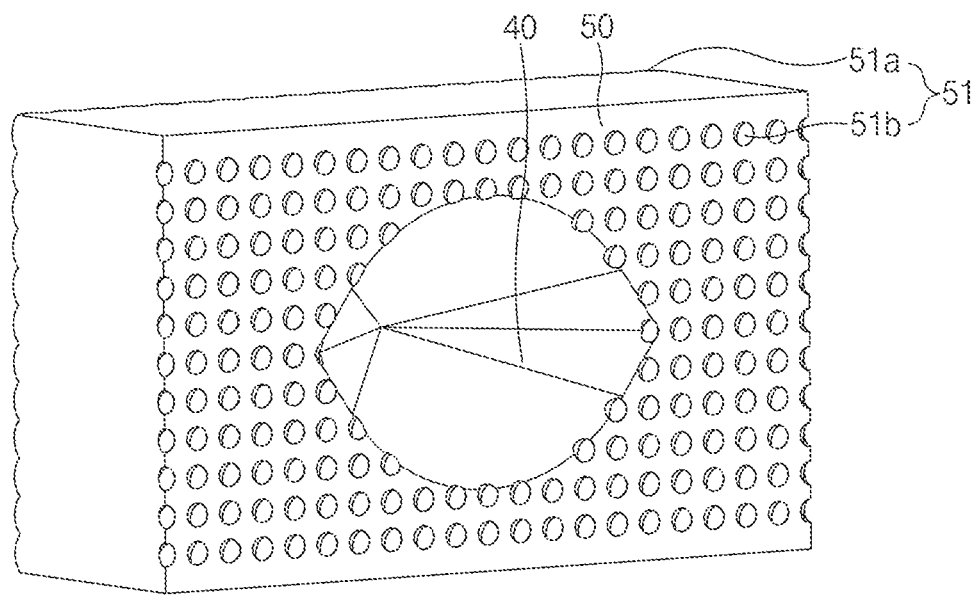
Figure 18:
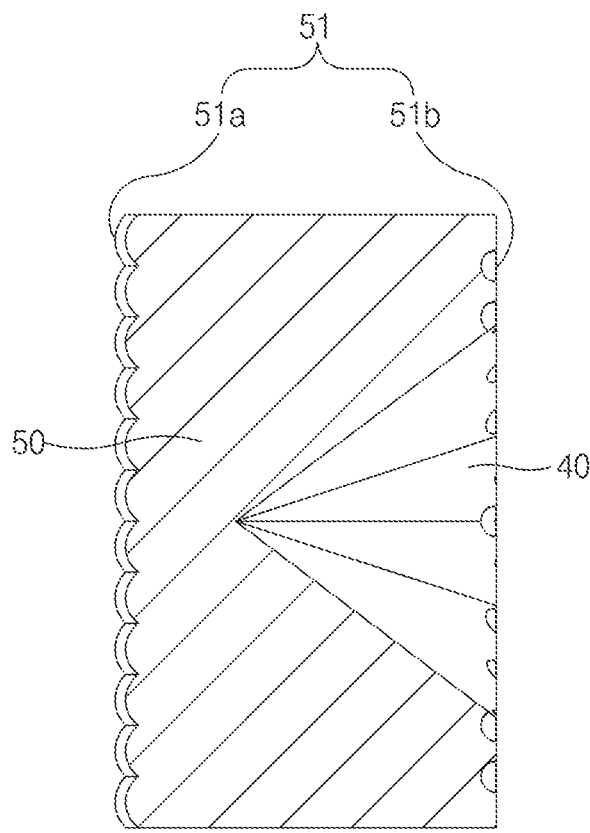
Figure 19:
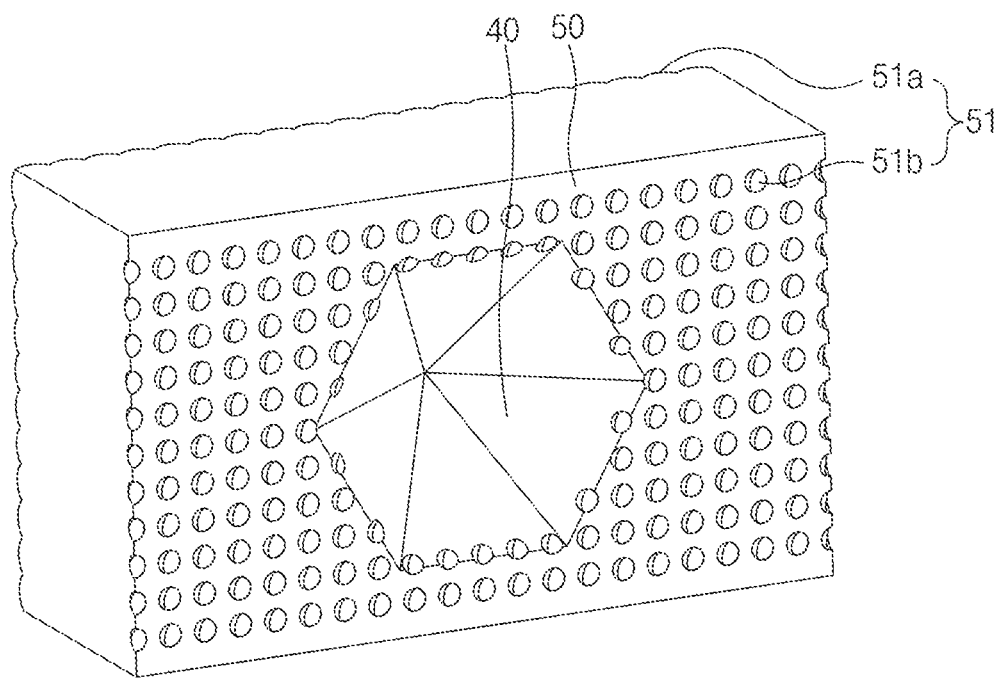
Figure 20:
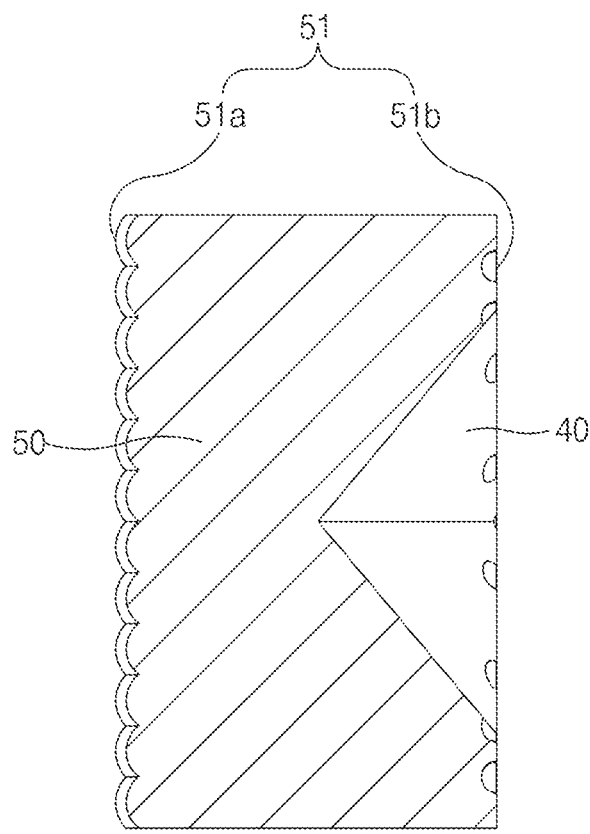
Figure 21:
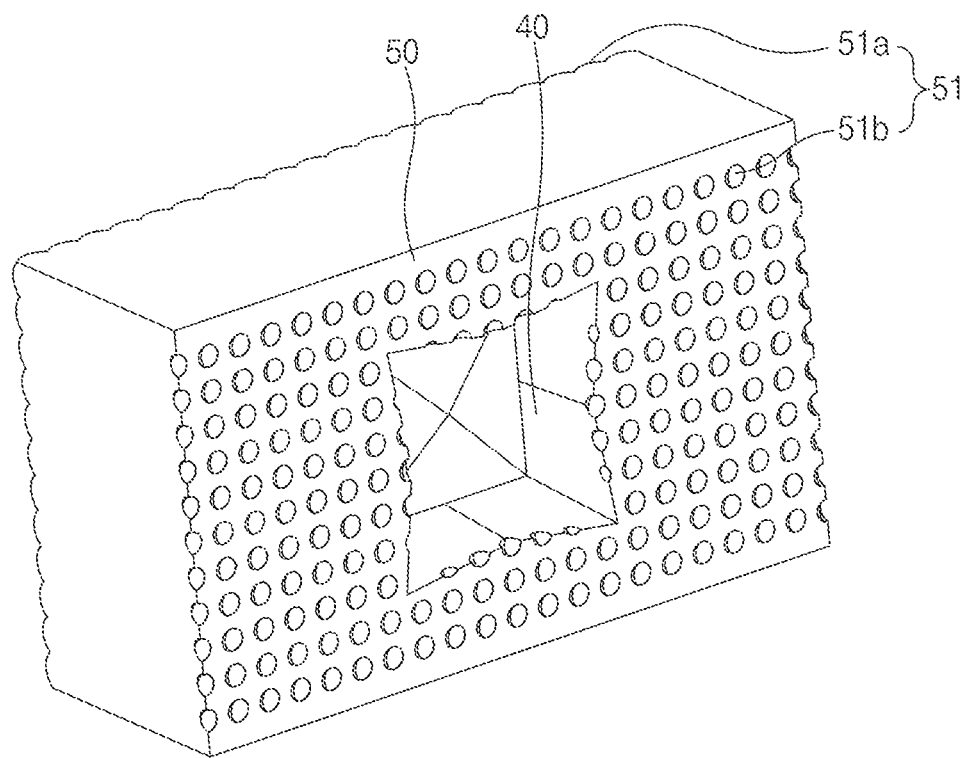
Figure 22:
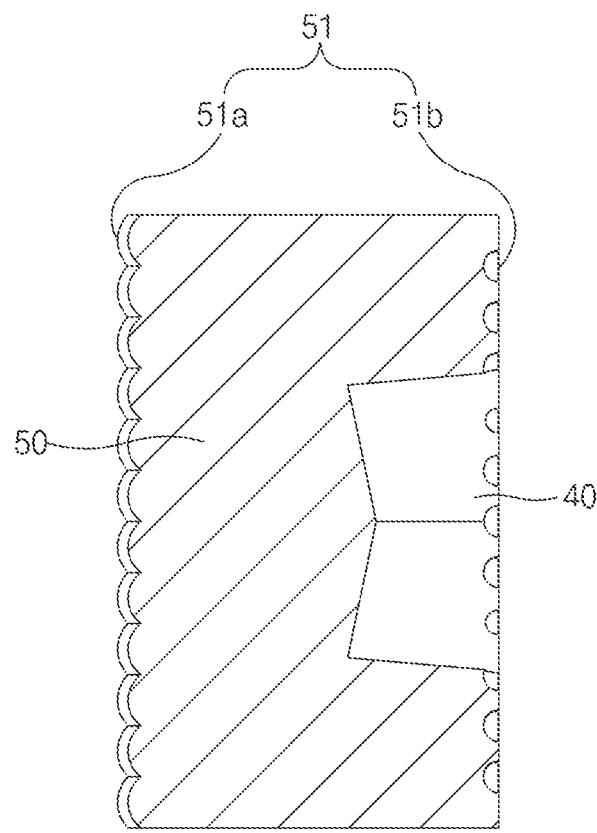

Meanwhile, the shape of the lens part 40 may be variously formed. FIG. 7 is a view illustrating an example of a shape of a lens part. FIG. 8 is a cross-sectional view of FIG. 7. FIG. 9 is a view illustrating another example of a shape of a lens part. FIG. 10 is a cross-sectional view of FIG. 8. Hereinafter, examples of the shape of the lens part will be described below with reference to FIGS. 7 to 10.

As an example, as illustrated in FIGS. 7 and 8, the lens part 40 may have a semielliptical shape when viewed from a side surface thereof.

As another example, as illustrated in FIGS. 9 and 10, the lens part 40 may have a semielliptical shape, an end portion of which, when viewed from a side surface thereof is, truncated or inwardly bowed. When the lens part 40 has the shapes illustrated in FIGS. 9 and 10, it is advantageous in removing a hot spot and a high light uniformity may be secured.

However, FIGS. 7 to 10 are simple examples of the shape of the lens part, and may be variously modified according to a necessity of a general technician. FIGS. 11, 13, 15, 17, 19, and 21 are views illustrating other examples of a lens shape of a lens part. FIGS. 12, 14, 16, 18, 20, and 22 are cross-sectional views of FIGS. 11, 13, 15, 17, 19, and 21. FIGS. 11 to 22 are views illustrating various modifiable examples of the lens part.

For example, a serration shape may be added to the lens part 40. Alternatively, the lens part 40 may have a cylindrical shape or may have a shape, in which a front end of a cylindrical shape is concave to the rear side.

Because refraction of the light emitted from the light emitting part 30 may become different as the shape of the lens part 40 is formed variously, a light path of the light emitting part 30 may be formed variously, and thus targets, such as removal of a hot spot or securing of light uniformity, may be achieved when a product is produced.

Meanwhile a forward/rearward length of the panel part 50 with respect to a portion of the panel part 50 of the LED module according to the first embodiment, at which the first recess 52 is not formed, is preferably 7 mm, but the present disclosure is not limited thereto, and may be variously modified in a range that is obtained by an ordinary person in the art.

LED Module According to Second Embodiment

Figure 23:
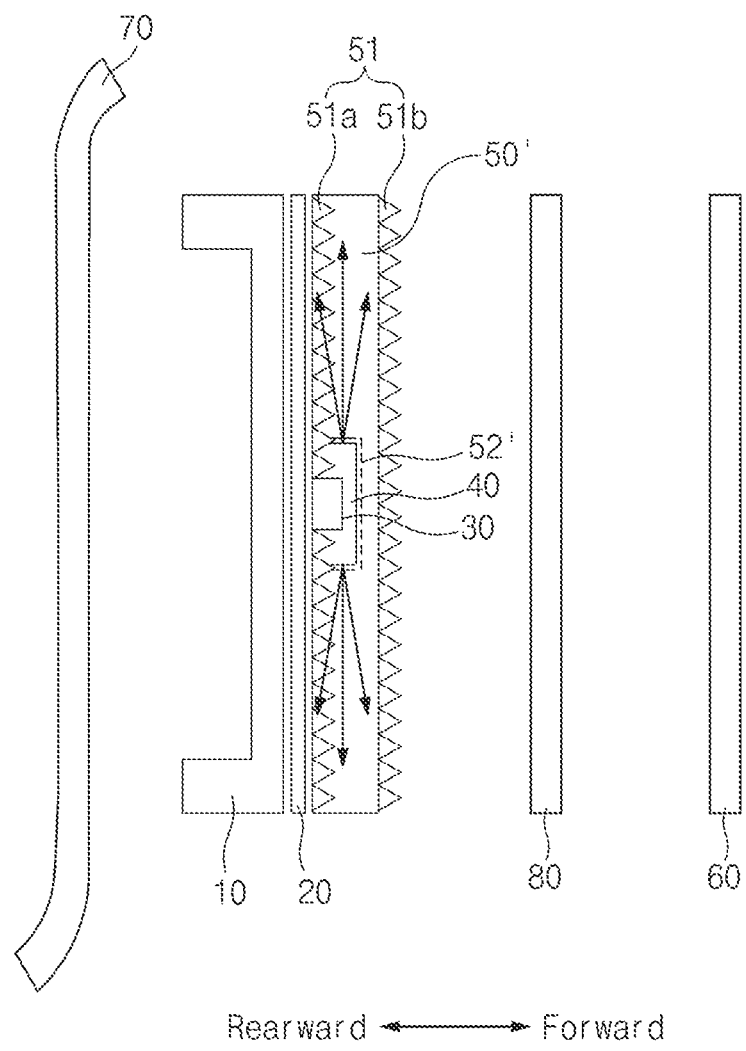
FIG. 23 is a conceptual view illustrating an LED module according to a second embodiment of the present disclosure.

FIG. 23 is a conceptual view illustrating an LED module according to a second embodiment of the present disclosure. A LED module according to a second embodiment of the present disclosure will be described with reference to FIGS. 23 and 1 to 22.

The LED module according to the second embodiment of the present disclosure is different from the LED module according to the first embodiment in presence of an inner lens 80 and a thickness of the panel part 50. The same or corresponding reference numerals are given to configurations that are the same as or correspond to those of the LED module according to the first embodiment, and a detailed description thereof will be omitted.

As illustrated in FIG. 23, the LED module according to the second embodiment of the present disclosure may further include an inner lens 80. The inner lens 80 may be positioned between the outer lens 60 and a panel part 50'.

Meanwhile, an upward/downward length of the inner lens 80 may correspond to an upward/downward length of the outer lens 60. Accordingly, an upward/downward length of the inner lens 80 may correspond to the upward/downward lengths of the panel part 50', the board part 20, and the cover part 10.

Meanwhile a forward/rearward length of the panel part 50' with respect to a portion of the panel part 50' of the LED module according to the second embodiment, at which a first recess 52' is not formed, is preferably 2.5 mm, but the present disclosure is not limited thereto, and may be variously modified in a range that is obtained by an ordinary person in the art.

Meanwhile, of course, as a forward/rearward length of the panel part 50' is changed, a relative size of a space occupied by the first recess 52' also may be changed.

LED Module According to Third Embodiment

Figure 24:
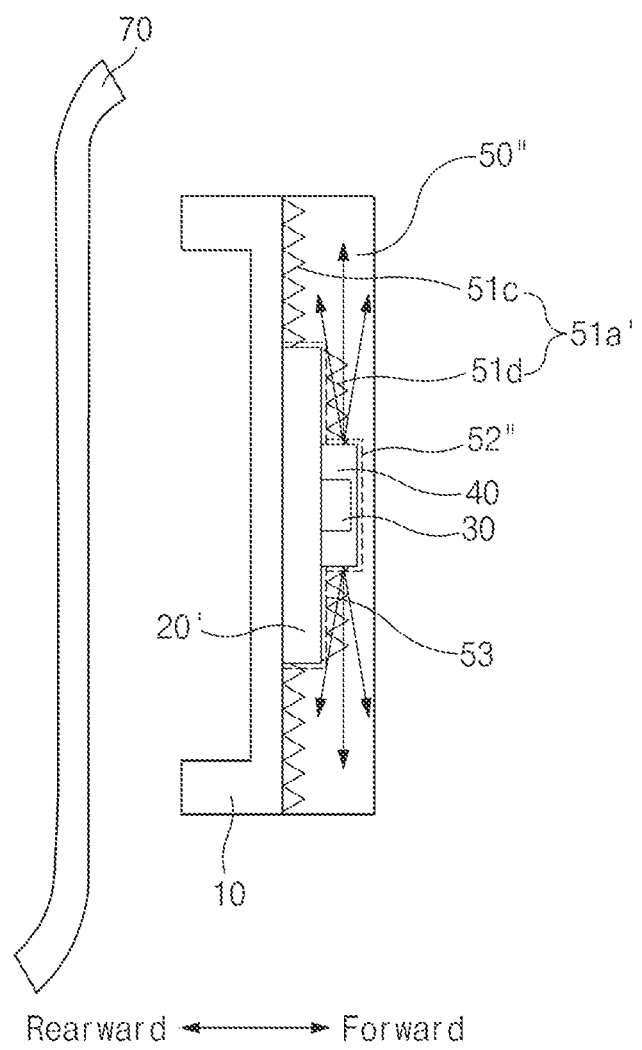
FIG. 24 is a conceptual view illustrating an LED module according to a third embodiment of the present disclosure.

FIG. 24 is a conceptual view illustrating an LED module according to a third embodiment of the present disclosure. Hereinafter, a LED module according to a third embodiment of the present disclosure will be described with reference to FIGS. 24 and 1 to 22.

The LED module according to a third embodiment of the present disclosure is different from the LED module according to the first embodiment in a shape of a panel part 50" and a first optic part 51a'. The same or corresponding reference numerals are given to configurations that are the same as or correspond to those of the bobbin according to the first embodiment, and a detailed description thereof will be omitted.

An upward/downward length of a board part 20' of the LED module according to the third embodiment of the present disclosure may be smaller than an upward/downward length of the cover part 10. Then, the panel part 50" may be formed to cover a side surface of the board part 20'.

As an example, the panel part 50" may include the second recess 53, into which the board part 20' is inserted. The second recess 53 may be communicated with a first recess 52", and an upward/downward length thereof may be larger than an upward/downward length of the first recess 52". Then, the panel part 50" may be formed to be adjacent to the cover part 10. Furthermore, accordingly, the first recess 52" of the LED module of the third embodiment may be displaced toward the center of the panel part 50" as compared with the first recess 52 according to the first embodiment.

As illustrated in FIG. 24, a first optic part 51a' may include a first area 51c and a second area 51d. The first area 51c may be formed on a side surface of the board part 20. The second area 51d may be formed on a front surface of the board part 20. The second area 51d may be stepped from the first area 51c.

Vehicle

Hereinafter, a vehicle including the LED modules according to the first to third embodiments of the present disclosure will be described below. Here, the vehicle is not limited simply to four-wheel vehicles, and has to be construed to widely include a transportation means such as a two-wheel vehicle. The vehicle may include a vehicle body and an LED module.

As illustrated in FIG. 3, the LED module may include the light emitting part 30, the lens part 40, and the panel part 50. The light emitting part 30 may be configured to emit light through a side surface thereof. The light emitting part 30 may a 4F LED. The lens part 40 may surround the side surfaces of the light emitting part 30. The lens part 40 may be inserted into and positioned in the panel part 50. The optic part 51 having a fine boss shape may be famed on an outer surface of the panel part 50.

According to the present disclosure, because a reflection plate is not necessary and the lens part may be adhered to the cover part, the volume of the product may be reduced and the weight of the product may be reduced.

Furthermore, according to the present disclosure, because the light may be emitted from the side surfaces of the light emitting part and the plurality of fine optic parts reflect the light at various angles at different locations, a uniformity of brightness may be secured.

The above description is a simple exemplification of the technical spirits of the present disclosure, and the present disclosure may be variously corrected and modified by those skilled in the art to which the present disclosure pertains without departing from the essential features of the present disclosure. Accordingly, the embodiments disclosed in the present disclosure is not provided to limit the technical spirits of the present disclosure but provided to describe the present disclosure, and the scope of the technical spirits of the present disclosure is not limited by the embodiments. Accordingly, the technical scope of the present disclosure should be construed by the attached claims, and all the technical spirits within the equivalent ranges fall within the scope of the present disclosure.

What is claimed is:
1. An LED module comprising:
  a cover part having a front surface;
  a board part disposed on the front surface of the cover part and having a front surface and a rear surface facing the front surface of the cover part;
  a panel part disposed on the front surface of the board part and having a front surface and a rear surface facing the front surface of the board part;
  a light emitting part disposed between the board part and the panel part and having (1) a front surface facing the rear surface of panel part, (2) a rear surface facing the front surface of the board part and (3) a side surface extending between the front and rear surfaces of the light emitting part, the light emitting part electrically connected to the board part and configured to emit light through the side surface; and a lens part disposed at the rear surface of the panel part and surrounding the side surface of the light emitting part, wherein the panel part has an optic part having a fine boss pattern, disposed at the front and rear surfaces of the panel part and configured to guide the light emitted through the side surface of the light emitting part toward the front surface of the panel part.

2. The LED module of claim 1, wherein the optic part includes a first optic part disposed at the rear surface of the panel part and recessed toward the front surface of the panel part and configured to reflect the light emitted from the side surface of the light emitting part and guide the reflected light toward the front surface of the panel part.

3. The LED module of claim 1, wherein a vertical length of the board part corresponds to that of the cover part.

4. The LED module of claim 1, wherein the vertical length of the panel part corresponds to that of the board part.

5. The LED module of claim 1, wherein the board part is white.

6. The LED module of claim 1, further comprising an outer lens disposed on and spaced apart from the front surface of the panel part.

7. The LED module of claim 1, wherein:
the panel part has a first recess disposed at the rear surface of the panel and having a shape corresponding to that of the lens part, and
the lens part is disposed at the first recess.

8. The LED module of claim 1, wherein the lens part has a semielliptical shape when viewed from a side of the lens part.

9. The LED module of claim 1, wherein the lens part has a semielliptical shape, an end portion of which, when viewed from the side surface thereof, is truncated.

10. The LED module of claim 1, wherein the lens part has a semielliptical shape, an end portion of which, when viewed from the side surface thereof, is inwardly bowed.

11. A vehicle comprising:
a vehicle body; and
the LED module of claim 1, disposed at the vehicle body.

12. The LED module of claim 2, wherein the optic part further includes a second optic part disposed at the front surface of the panel part, protruding in a forward direction from the rear surface to the front surface of the panel part and the configured to guide the light emitted from the side surface of the light emitting part toward the front portion of the panel part.

13. The LED module of claim 2, wherein a vertical length of the first optic part at a first distance from the front surface of the panel part is less than that of the first optic part at a second distance from the front surface of the panel part that is greater than the first distance.

14. The LED module of claim 12, wherein the first optic part has a shape corresponding to that of the second optic part.

15. The LED module of claim 6, wherein a vertical length of the outer lens corresponds to that of the panel part.

16. The LED module of claim 6, further comprising an inner lens positioned between the outer lens and the panel part.

17. An LED module comprising:
a cover part having a front surface;
a board part disposed on the front surface of the cover part and having a front surface and a rear surface facing the front surface of the cover part;
a panel part disposed on the front surface of the board part and having a front surface and a rear surface facing the front surface of the board part;
a light emitting part disposed between the board part and the panel part and having (1) a front surface facing the rear surface of panel part, (2) a rear surface facing the front surface of the board part and (3) a side surface extending between the front and rear surfaces of the light emitting part, the light emitting part electrically connected to the board part and configured to emit light through the side surface; and
a lens part disposed at the rear surface of the panel part and surrounding the side surface of the light emitting part,
wherein the panel part has an optic part having a fine boss pattern, disposed at the rear surface of the panel part and configured to guide the light emitted through the side surface of the light emitting part toward the front surface of the panel part,
wherein a vertical length of the board part is smaller than that of the cover part,
wherein the panel part is configured to cover a side surface of the board part, and
wherein the optic part includes:
a first optic part disposed at a first portion of the rear surface of the panel part facing the cover part and surrounding the side surface of the board part; and
a second optic part disposed at a second portion of the rear surface of the panel facing the board part.

18. The LED module of claim 17, wherein:
the panel part has a recess at the rear surface of the panel part, the recess having a shape corresponding to that of the board part, and
the board part is disposed at the second recess.

* * * * *